United States Patent
Blanchard

(10) Patent No.: US 7,339,252 B2
(45) Date of Patent: Mar. 4, 2008

(54) SEMICONDUCTOR HAVING THICK DIELECTRIC REGIONS

(75) Inventor: Richard A. Blanchard, Los Altos, CA (US)

(73) Assignee: Third Dimension (3D) Semiconductor, Inc., Tempe, AZ (US)

( * ) Notice: Subject to any disclaimer, the term of this patent is extended or adjusted under 35 U.S.C. 154(b) by 138 days.

(21) Appl. No.: 11/384,565

(22) Filed: Mar. 20, 2006

(65) Prior Publication Data

US 2006/0163690 A1    Jul. 27, 2006

Related U.S. Application Data

(62) Division of application No. 11/004,694, filed on Dec. 3, 2004, now Pat. No. 7,023,069.

(60) Provisional application No. 60/531,373, filed on Dec. 19, 2003.

(51) Int. Cl.
*H01L 21/762*    (2006.01)

(52) U.S. Cl. ............... 257/510; 257/E21.547; 257/E21.549; 257/E21.55; 257/E21.551

(58) Field of Classification Search ............ 257/510, 257/E21.547, E21.549, E21.55, E21.551
See application file for complete search history.

(56) References Cited

U.S. PATENT DOCUMENTS

| | | | |
|---|---|---|---|
| 4,158,206 A | | 6/1979 | Neilson |
| 4,211,582 A | * | 7/1980 | Horng et al. ............... 438/426 |
| 4,238,278 A | * | 12/1980 | Antipov ...................... 438/426 |
| 4,491,486 A | * | 1/1985 | Iwai ............................ 438/426 |
| 4,895,810 A | | 1/1990 | Meyer et al. |
| 4,994,406 A | * | 2/1991 | Vasquez et al. ............ 438/426 |
| 5,019,522 A | | 5/1991 | Meyer et al. |
| 5,045,903 A | | 9/1991 | Meyer et al. |
| 5,216,275 A | | 6/1993 | Chen |
| 5,366,914 A | | 11/1994 | Takahashi et al. |
| 5,395,790 A | * | 3/1995 | Lur ............................. 438/445 |
| 5,432,113 A | * | 7/1995 | Tani .......................... 438/386 |
| 5,435,888 A | | 7/1995 | Kalnitsky et al. |
| 5,472,888 A | | 12/1995 | Kinzer |
| 5,506,421 A | | 4/1996 | Palmour |
| 5,598,018 A | | 1/1997 | Lidow et al. |
| 5,742,087 A | | 4/1998 | Lidow et al. |
| 5,744,994 A | | 4/1998 | Williams |
| 5,786,619 A | | 7/1998 | Kinzer |
| 5,902,127 A | | 5/1999 | Park |
| 5,926,713 A | * | 7/1999 | Hause et al. ................ 438/296 |
| 5,929,690 A | | 7/1999 | Williams |
| 5,939,754 A | | 8/1999 | Hoshi |

(Continued)

*Primary Examiner*—George Fourson
(74) *Attorney, Agent, or Firm*—Panitch Schwarze Belisario & Nadel LLP

(57) ABSTRACT

A method of manufacturing a semiconductor device includes providing a semiconductor substrate having first and second main surfaces opposite to each other. The method also includes providing in the semiconductor substrate one or more trenches, first mesas and second mesas. The method also includes oxidizing sidewalls and bottoms of each trench; depositing a doped oxide into each trench and on the tops of the first and second mesas; and thermally oxidizing the semiconductor substrate at a temperature sufficient enough to cause the deposited oxide to flow so that the silicon in each of the first mesas is completely converted to silicon dioxide while the silicon in each of the second mesas is only partially converted to silicon dioxide and so that each of the trenches is filled with oxide.

16 Claims, 8 Drawing Sheets

U.S. PATENT DOCUMENTS

| | | |
|---|---|---|
| 6,008,106 A * | 12/1999 | Tu et al. ............... 438/426 |
| 6,081,009 A | 6/2000 | Neilson |
| 6,184,555 B1 | 2/2001 | Tihanyi et al. |
| 6,190,970 B1 | 2/2001 | Liao et al. |
| 6,198,127 B1 | 3/2001 | Kocon |
| 6,214,698 B1 | 4/2001 | Liaw et al. |
| 6,222,229 B1 | 4/2001 | Hebert et al. |
| 6,239,463 B1 | 5/2001 | Williams et al. |
| 6,265,281 B1 | 7/2001 | Reinberg |
| 6,291,856 B1 | 9/2001 | Miyasaka et al. |
| 6,300,171 B1 | 10/2001 | Frisina |
| 6,307,246 B1 | 10/2001 | Nitta et al. |
| 6,359,309 B1 | 3/2002 | Liao et al. |
| 6,362,505 B1 | 3/2002 | Tihanyi |
| 6,391,723 B1 | 5/2002 | Frisina |
| 6,410,958 B1 | 6/2002 | Usi et al. |
| 6,452,230 B1 | 9/2002 | Boden, Jr. |
| 6,459,142 B1 | 10/2002 | Tihanyi |
| 6,465,325 B2 | 10/2002 | Ridley et al. |
| 6,495,421 B2 | 12/2002 | Luo |
| 6,501,130 B2 | 12/2002 | Disney |
| 6,501,146 B1 | 12/2002 | Harada |
| 6,504,230 B2 | 1/2003 | Deboy et al. |
| 6,509,220 B2 | 1/2003 | Disney |
| 6,613,644 B2 * | 9/2003 | Lachner ............... 438/424 |
| 6,614,062 B2 * | 9/2003 | Chheda et al. ............... 257/206 |
| 6,635,906 B1 | 10/2003 | Chen |
| 6,797,589 B2 * | 9/2004 | Adams et al. ............... 438/426 |
| 2002/0070418 A1 | 6/2002 | Kinzer et al. |
| 2005/0176192 A1* | 8/2005 | Hshieh ............... 438/197 |
| 2005/1076192 | 8/2005 | Hshieh |

* cited by examiner

SEMICONDUCTOR HAVING THICK DIELECTRIC REGIONS

CROSS-REFERENCE TO RELATED APPLICATIONS

This application is a divisional of application Ser. No. 11/004,694, filed Dec. 3, 2004, now U.S. Pat. No. 7,023,069, entitled "Method for Forming Thick Dielectric Regions Using Etched Trenches." This application claims priority to U.S. Provisional Patent Application No. 60/531,373, filed Dec. 19, 2003, entitled "A Technique for Forming Thick Dielectric Regions Using Etched Trenches."

BACKGROUND OF THE INVENTION

The present invention relates to a method for manufacturing a semiconductor device having an edge termination structure that includes a thick oxide region and particularly to a semiconductor device which is metal-oxide semiconductor (MOS)-gated, and that is suitable for power switching, having both a low on-resistance and a high breakdown voltage.

Since the invention of superjunction devices by Dr. Xingbi Chen, as disclosed in U.S. Pat. No. 5,216,275, there have been many attempts to expand and improve on the superjunction effect of his invention. U.S. Pat. Nos. 6,410,958, 6,300,171 and 6,307,246 are examples of such efforts and are incorporated herein by reference.

U.S. Pat. No. 6,410,958 ("Usui, et al.") relates to an edge termination structure and a drift region for a semiconductor component. A semiconductor body of the one conductivity type has an edge area with a plurality of regions of the other conductivity type embedded in at least two mutually different planes. Underneath the active zone of the semiconductor component, the drift regions are connected using the underlying substrate.

U.S. Pat. No. 6,307,246 ("Nitta, et al.") discloses a semiconductor component having a high-voltage sustaining edge structure in which a multiplicity of parallel-connected individual components are disposed in a multiplicity of cells of a cell array. In an edge region, the semiconductor component has cells with shaded source zone regions. During commutation of the power semiconductor component, the shaded source zone regions suppress the switching "on" of a parasitic bipolar transistor caused by the disproportionately large reverse flow current density. Moreover, an edge structure having shaded source zone regions can be produced very easily in technological terms that are discussed in the Nitta, et al. patent. It clarifies the effects of parameters and enables the mass production of a superjunction semiconductor device which has a drift layer composed of a parallel PN layer that conducts electricity in the "on" state and is depleted in the "off" state. The net quantity of active impurities in the n-type drift regions is within the range of 100% to 150% of the net quantity of active impurities in the p-type partition regions. In addition, the width of either one of the n-type drift regions and the p-type partition regions is within the range between 94% and 106% of the width of the other regions.

U.S. Pat. No. 6,300,171 ("Frisina") discloses a method for manufacturing an edge structure for a high voltage semiconductor device including a first step of forming a first semiconductor layer of a first conductivity type, a second step of forming a first mask over the top surface of the first semiconductor layer, a third step of removing portions of the first mask in order to form at least one opening in it, a fourth step of introducing dopant of a second conductivity type in the first semiconductor layer through the at least one opening, a fifth step of completely removing the first mask and of forming a second semiconductor layer of the first conductivity type over the first semiconductor layer and a sixth step of diffusing the dopant implanted in the first semiconductor layer in order to form a doped region of the second conductivity type in the first and second semiconductor layers. The second step up to the sixth step are repeated at least one time in order to form a final edge structure having a number of superimposed semiconductor layers of the first conductivity type and at least two columns of doped regions of the second conductivity type. The columns are inserted in the number of superimposed semiconductor layers and formed by superimposition of the doped regions subsequently implanted through the mask openings. The column near the high voltage semiconductor device is deeper than the column farther from the high voltage semiconductor device.

It is desirable to provide a high voltage semiconductor device having an edge termination region that is manufactured by using only a single epitaxial deposition step.

BRIEF SUMMARY OF THE INVENTION

Briefly stated, the present invention comprises a method of manufacturing a semiconductor device that includes providing a semiconductor substrate having first and second main surfaces opposite to each other. The semiconductor substrate has a heavily doped region of a first or a second conductivity type proximate the second main surface and has a lightly doped region of the first conductivity type proximate the first main surface. The method also includes providing in the semiconductor substrate one or more trenches, first mesas and second mesas. Each trench is disposed between adjacent mesas and each trench has an approximate equal width along its entire length. The first mesas has a width substantially less than a width of the second mesas. The method also includes oxidizing sidewalls and bottoms of each trench; depositing a doped oxide into each trench and on the tops of the first and second mesas; and thermally oxidizing the semiconductor substrate at a temperature sufficient enough to cause the deposited oxide to flow so that the silicon in each of the first mesas is completely converted to silicon dioxide while the silicon in each of the second mesas is only partially converted to silicon dioxide and so that each of the trenches is filled with oxide.

The present invention also comprises a method of manufacturing a semiconductor device that includes providing a semiconductor substrate having first and second main surfaces opposite to each other. The semiconductor substrate has a heavily doped region of a first or second conductivity type proximate the second main surface and has a lightly doped region of the first conductivity type proximate the first main surface. The method also includes providing in the semiconductor substrate at least one trench, at least one first mesa and at least one second mesa. The at least one trench is disposed between adjacent mesas. The at least one first mesa has a width substantially less than a width of the at least one second mesa. Each mesa has a first extending portion extending from the first main surface toward the heavily doped region to a first depth position while having a sidewall surface with a predetermined inclination maintained relative to the first main surface, with each trench having an approximate equal width and with each member of the plurality of trenches having approximate equal width and with each mesa region being surrounded by a trench. The method also includes obliquely implanting a dopant of the second conductivity type into a sidewall surface of each mesa to form at the sidewall surface of each mesa. A first doped region of the second conductivity type has a doping concentration lower than that of the heavily doped region to provide a PN junction located along the depth direction of each trench. The method also includes oxidizing the bottom of each trench and its sidewalls to create a bottom oxide layer; depositing an oxide layer using doped silicon dioxide selected from a group that includes phospho-silicate glass (PSG), boro-silicate glass (BSG) and boro-phospho-silicate glass (BPSG) into each trench; thermally oxidizing the semiconductor substrate at a temperature sufficiently high to allow the deposited oxide to flow so that the silicon in the at least one first mesa region is completely converted to silicon dioxide while the silicon in the at least one second mesa is only partially converted to silicon dioxide and so each of the trenches is filled with oxide; and planarizing the top surface of the semiconductor device.

The present invention also comprises a semiconductor device including a semiconductor substrate and a doped oxide layer within at least the plurality of trenches. The semiconductor substrate has first and second main surfaces opposite to each other, a heavily doped region of a first or a second conductivity type proximate the second main surface and a lightly doped region of the first conductivity type proximate the first main surface. The first main surface includes a plurality of trenches, a plurality of first mesas and a plurality of second mesas. The first mesas have a width substantially less than a width of the second mesas. The trenches are disposed between adjacent mesas. The first mesas are completely formed of silicon dioxide and the second mesas are partially formed of silicon dioxide and partially formed of silicon.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For purposes of illustrating the invention, there are shown in the drawings embodiments which are presently preferred. It should be understood, however, that the invention is not limited to the precise arrangements and instrumentalities shown.

DETAILED DESCRIPTION OF THE INVENTION

Figure 1:
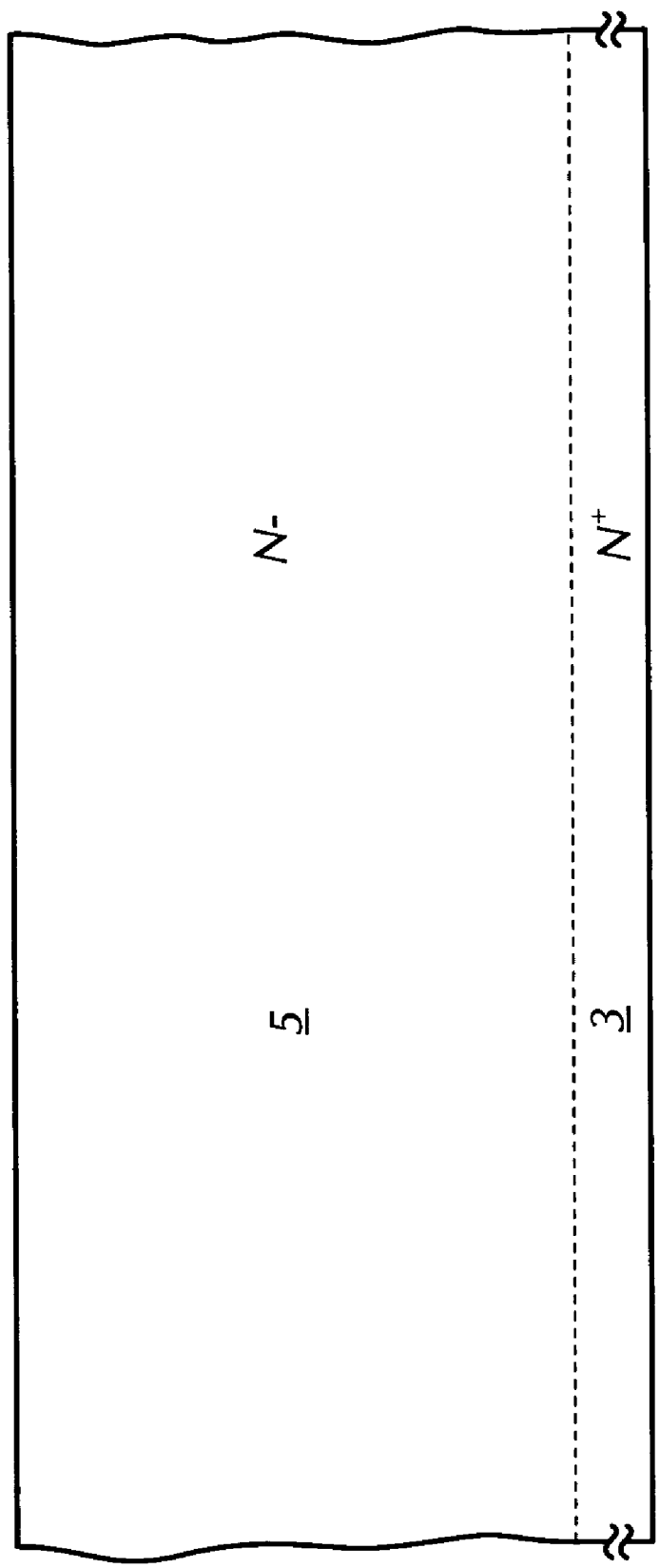
FIG. 1 is a partial sectional view of a semiconductor wafer used to manufacture a high voltage metal oxide semiconductor field effect transistor (MOSFET)

Certain terminology is used in the following description for convenience only and is not limiting. The words "right", "left", "lower", and "upper" designate directions in the drawing to which reference is made. The words "inwardly" and "outwardly" refer direction toward and away from, respectively, the geometric center of the object described and designated parts thereof. The terminology includes the words above specifically mentioned, derivatives thereof and words of similar import. Additionally, the word "a", as used in the claims and in the corresponding portions of the specification, means "at least one."

Referring to FIG. 1, there is shown a partial view of a semiconductor wafer that includes an $N^+$ substrate 3 and an $N^-$-doped epitaxial layer 5. As used herein, reference to conductivity will be limited to the embodiment described. However, those skilled in the art know that P-type conductivity can be switched with N-type conductivity and vice versa and that a P-channel metal oxide semiconductor field effect transistor (MOSFET) manufactured using P-type epitaxy over a $P^+$ substrate would function (i.e., a first or a second conductivity type). MOS-gated devices such as insulated gate bipolar transistors (IGBTs) and the like can also be fabricated in an epitaxial wafer with an N-type epitaxial layer over a $P^+$-doped substrate (or vice versa). The present invention can be applied to any epitaxial wafer semiconductor device configured with trenches and mesas that are filled with a resistive oxide. However, in order to maintain clarity in the specification, only the fabrication of an N-channel MOSFET will be fully described.

Figure 2:
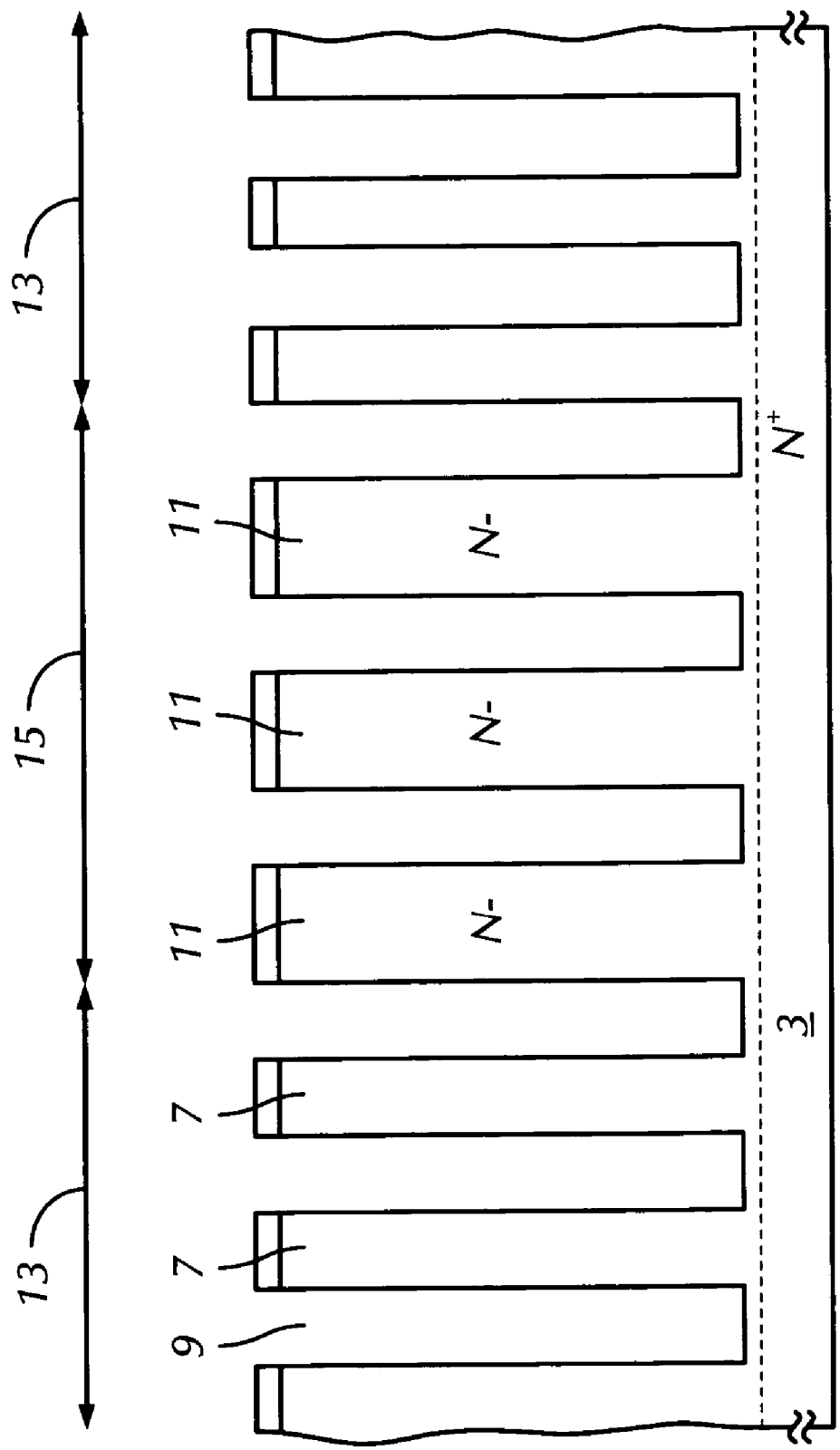
FIG. 2 is a partial sectional view of the semiconductor wafer after the trench etch step.

Referring to FIG. 2, using techniques known in the art, the epitaxial layer 5 is etched, forming trenches that approach the interface between the substrate 3 and the epitaxial layer 5, but are not closer than a distance that will affect device breakdown. The etch process creates trenches 9, and first mesas 7 and second mesas 11. The first mesas 7 are referred to as "sacrificial mesas" because they will be converted to silicon dioxide during the process steps described herein. The second mesas 11, which are the "device mesas," will be used to form the voltage sustaining layer for each transistor cell manufactured by the process. As indicated by arrows 13, the mesas 7 are located in what is called the termination region or the edge termination region. Also indicated by arrows 15, the mesas 11 are located in the active area. Both types of mesas 7, 11 have a layer of dielectric present which serves as a masking layer during the trench etch step. Though not shown clearly, the trenches 9 are preferably wider at their tops by 1%-10% than at their bottoms to facilitate the trench fill process.

Figure 3:
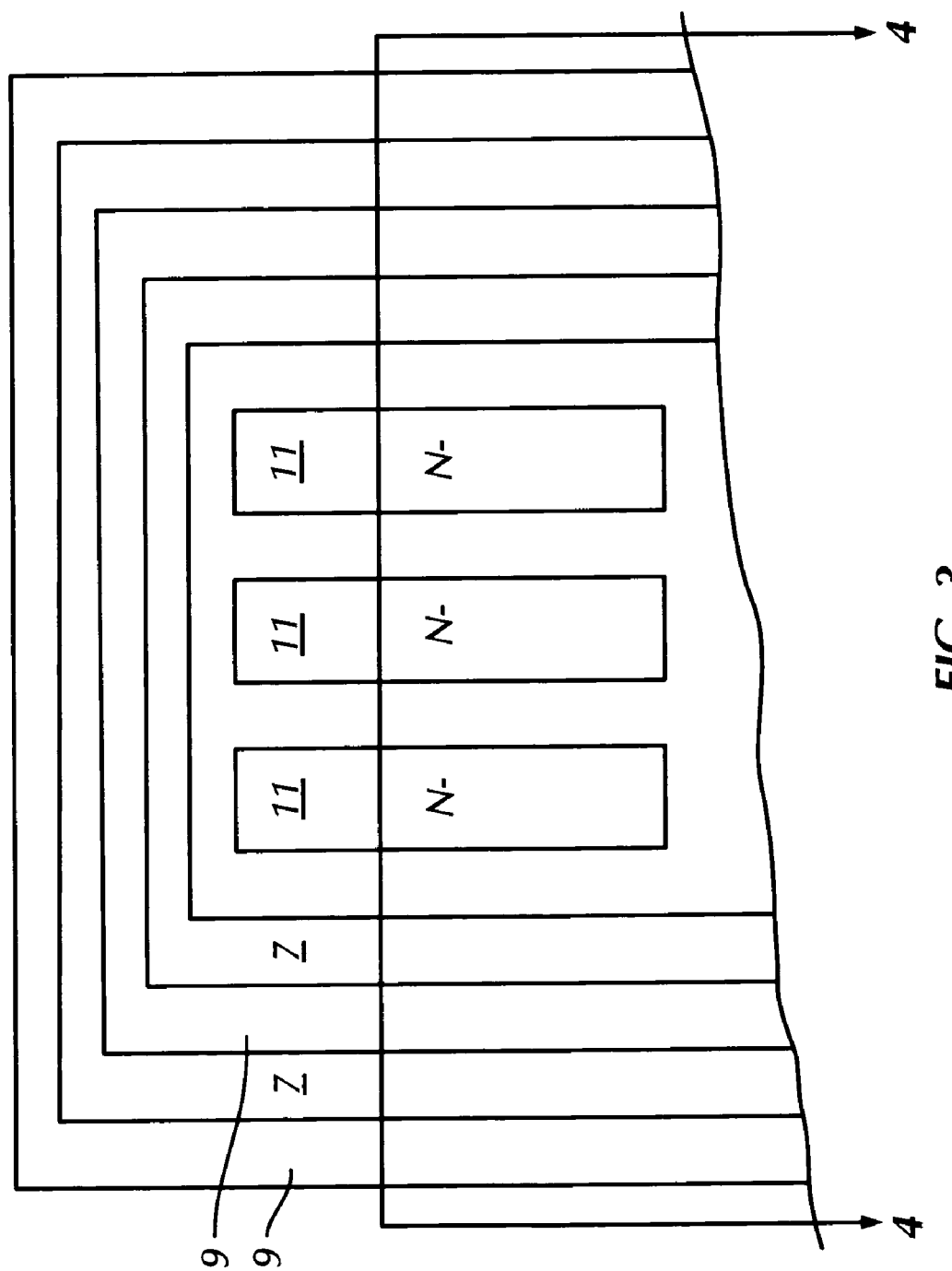
FIG. 3 is a partial top view of the semiconductor wafer of FIG. 2.

FIG. 3 shows a top plan view of FIG. 2, where a plurality of device mesas 11 and sacrificial mesas 7 are shown. It should be observed that the mesas 11 are wider than the mesas 7. This difference in width is necessary because during the oxidation process a portion of the mesas 11 will be converted to silicon dioxide while all of mesas 7 are converted to silicon dioxide. However, the width of the trenches 9 adjacent to mesas 7 and 11 are about the same.

The sidewalls of each trench 9 may be smoothed, if needed, using one or more of the following process steps following the initial trench etch:

an isotropic plasma etch may be used to remove a thin layer of silicon (typically about 100-1000 Angstroms) from the trench surfaces.

a sacrificial silicon dioxide layer may be grown on the surfaces of the trench 9 and then removed using an etch such as a buffered oxide etch or a diluted hydrogen fluoride (HF) etch.

The use of either or both of these techniques can produce smooth trench surfaces with rounded corners while removing residual stress and unwanted contaminants.

Figure 4:
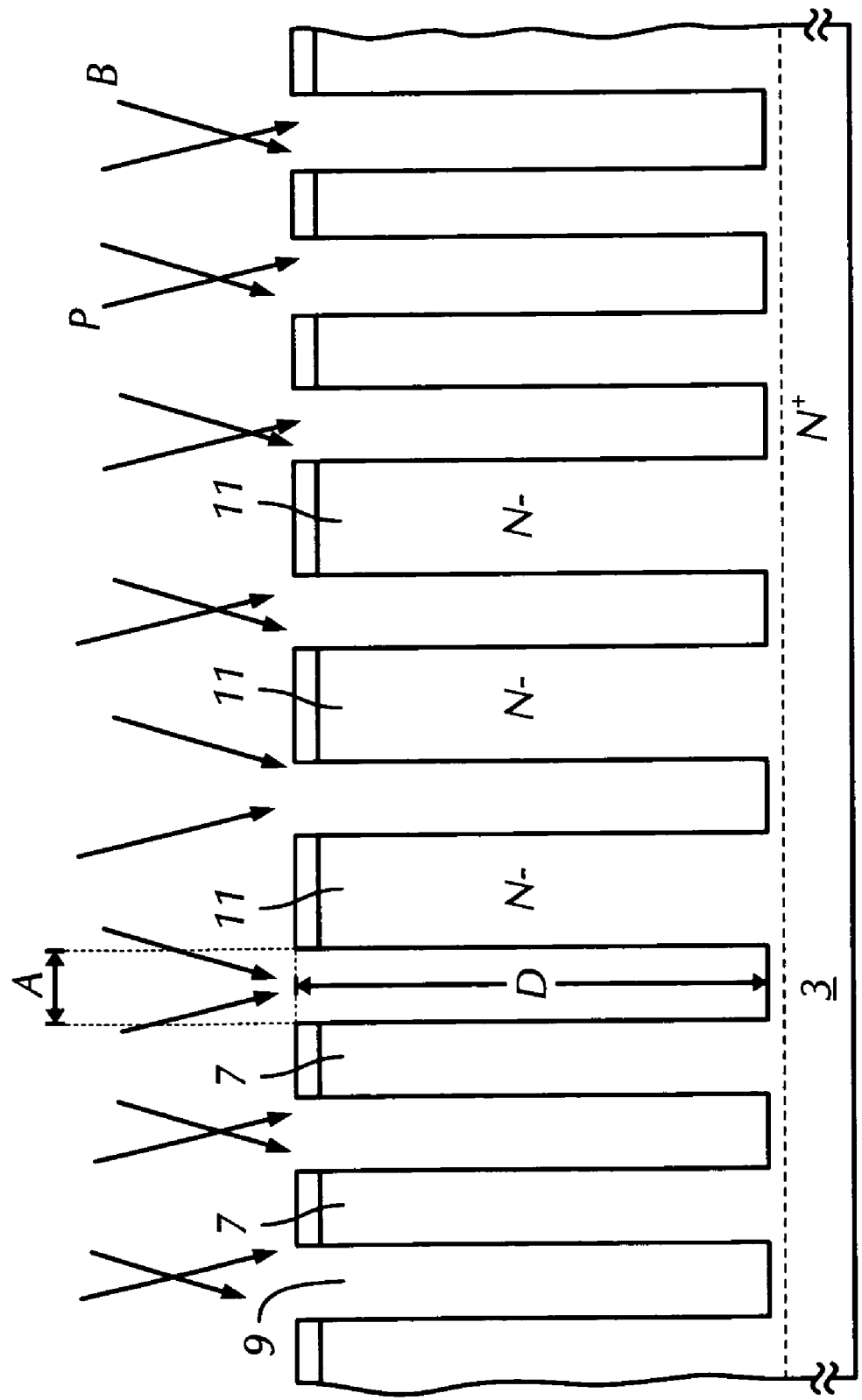
FIG. 4 is a partial sectional view of the semiconductor wafer of FIG. 2 having an ion implant step performed.

There are several techniques that may be used to dope the sidewalls of the trenches 9. One of these techniques is discussed in the remainder of the specification. Proceeding to FIG. 4, with the wafers at a slight angle with respect to the ion beam, but without the need for of a masking step, selected sidewalls of mesas 11 and 7 are implanted with boron as is indicated by the implant arrows B. The typical angle of implant is between about 2° and 12°. However, the angle of implant for boron (B) is determined by the width A and the depth D of the trenches 9.

Figure 5:
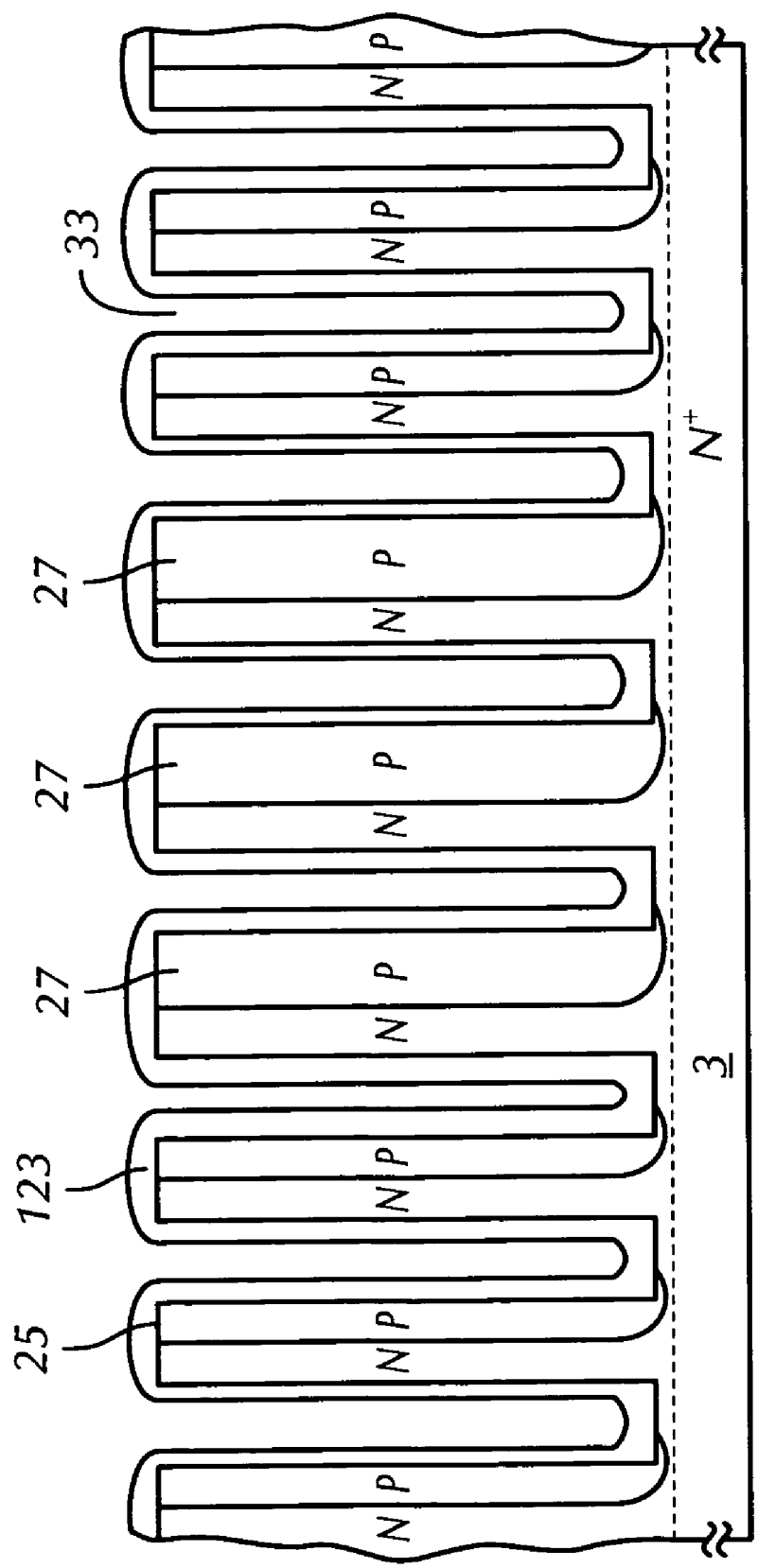
FIG. 5 is a partial sectional view of the semiconductor wafer of FIG. 4 after an oxidation step.
Figure 6:
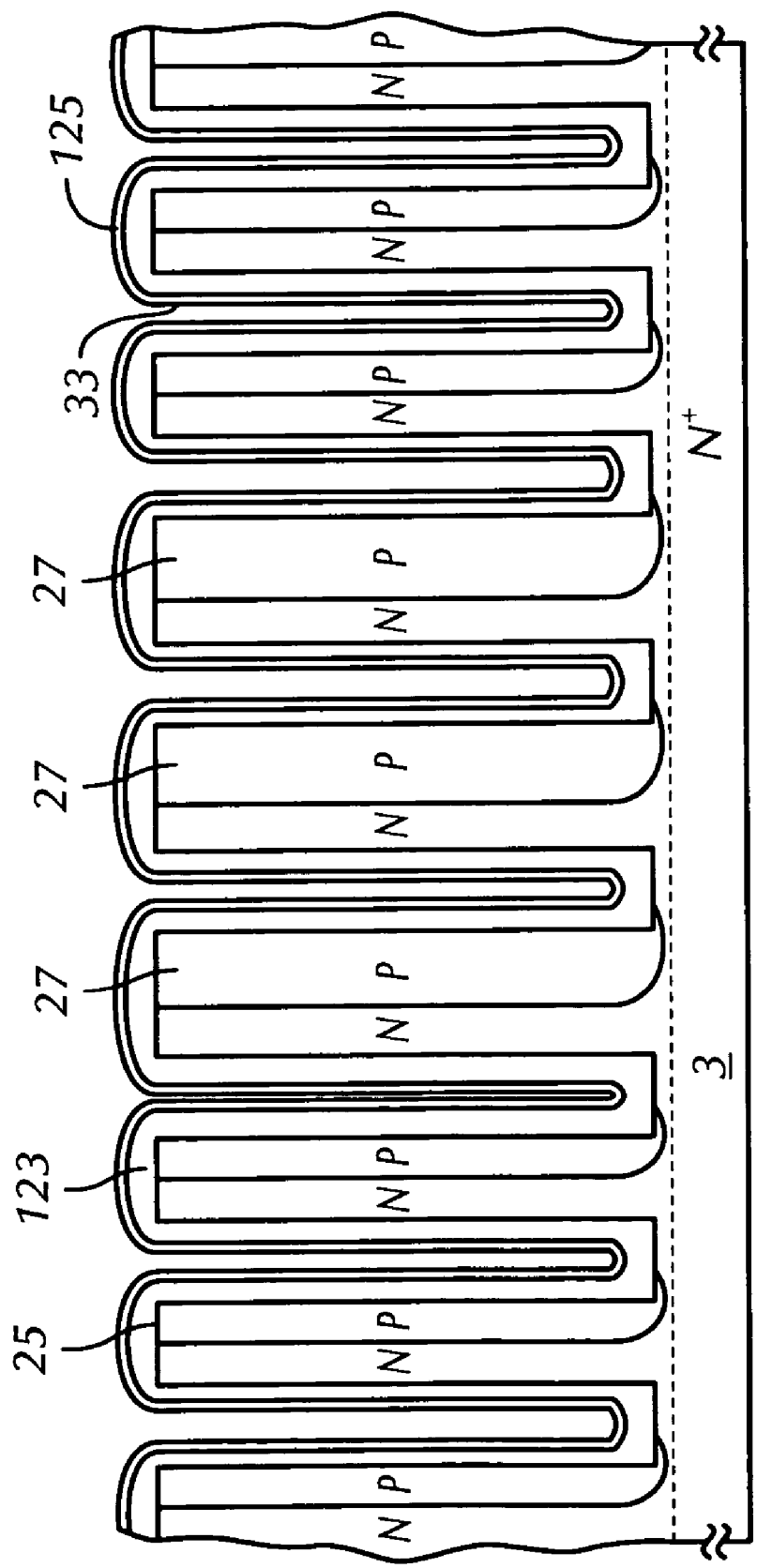
FIG. 6 is a partial sectional view of the semiconductor wafer of FIG. 5 after the deposition of a layer of doped glass.

Referring to FIG. 5, following the diffusion of the implanted dopant, an oxidation step, usually performed in steam, occurs during which the mesas 7 and the mesa 11 are converted to pillars 25 and 27 containing both n-type and p-type dopant that are surrounded by silicon dioxide 123. It is preferable to leave small gaps 33 between each oxide mesa and to not filly oxide the sacrificial mesas 7 following the first oxidation. The gaps 33, which are also slightly wider at their tops, are then partially filled with doped silicon dioxide 125 such as phospho-silicate glass (PSG), boro-silicate glass (BSG) or boro-phospho-silicate glass (BPSG). Other similar oxide materials may be utilized. This step is shown in FIG. 6.

Figure 7:
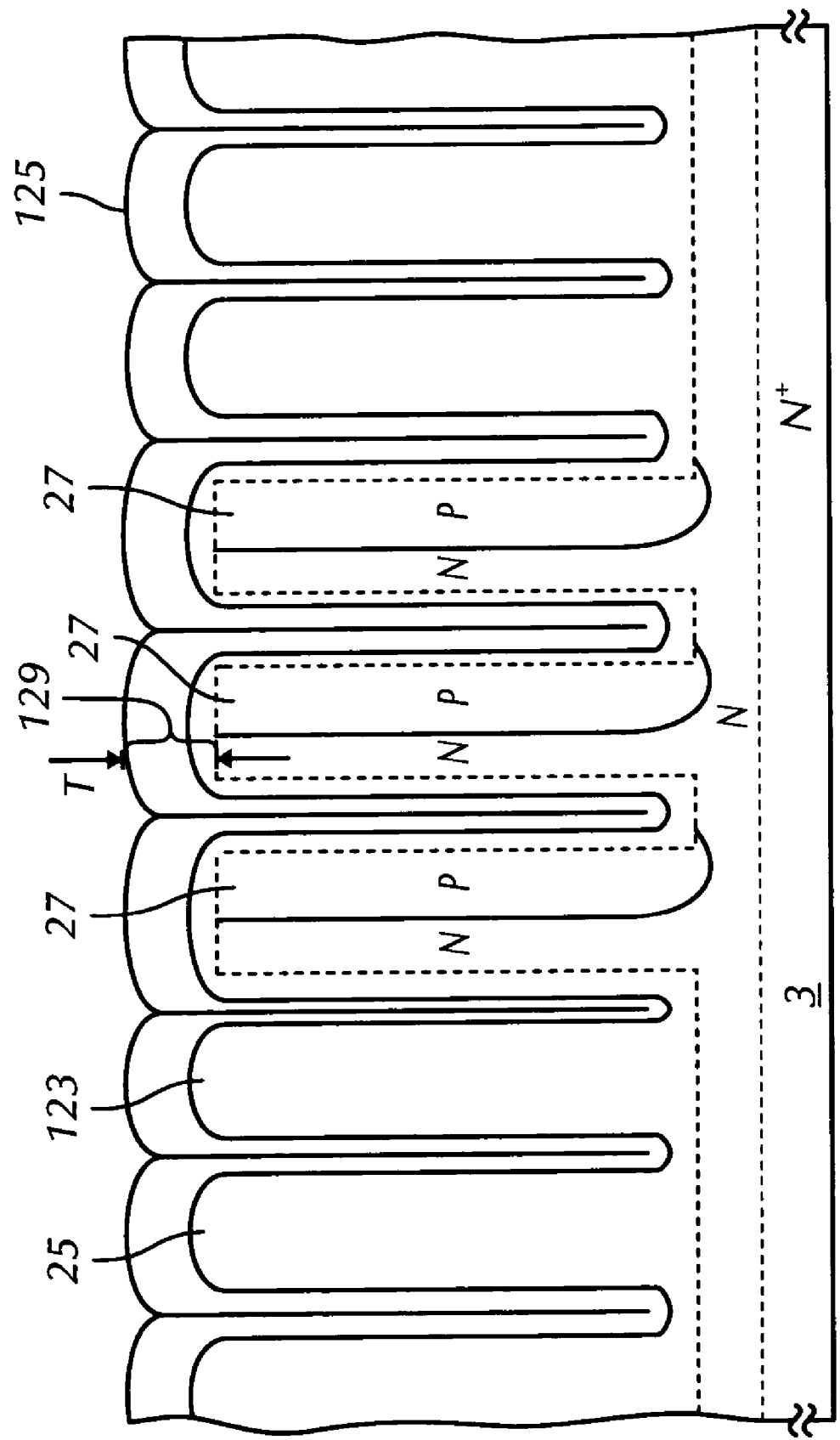
FIG. 7 is a partial sectional view of the semiconductor wafer of FIG. 6 after a combination oxidation and reflow step.

In FIG. 7, the doped silicon dioxide layer 125 has been heated to a temperature between about 800° C. and 1,000° C., depending on the doping concentration and type of dopant in the deposited glass, in an oxidizing ambient. The combination of heat and the oxidizing atmosphere converts the remaining silicon in mesas 7 to silicon dioxide, while leaving part of the silicon of mesas 11 unconverted, and allows the combination of doped glass, which will flow, and the oxide created by the conversion of the silicon remaining in mesas 7, to completely fill all of the gaps 33.

The width A of the trenches 9 and the mesas 7 is not arbitrary. In the oxidation of silicon, for every 0.1 micrometers or microns (μm) of silicon dioxide produced, approximately 0.0450 microns of silicon is consumed. Therefore, to fill each trench 9 of width A, the amount of silicon consumed is about 0.45A (one-half of which comes from each of the two opposing trench sidewalls). The ratio of the trench width A to the amount of oxide consumed is (1.0−0.45)/0.45=0.55/0.45=1.22 so each trench must be a minimum of 1.22 times wider than the sacrificial mesas 7 immediately after the etch step. To allow for the additional oxide thickness that is provided by the deposited oxide, the thermally grown oxide should typically provide between 70% and 95% of the total oxide in the trench 9. For a given trench width A, the sacrificial mesas 7 should be between about (0.7×0.45=) 0.32 and (0.95×0.45=) 0.43 of the trench width A immediately after the etch step. Normally, the trench width A will be in the range of 0.5 μm to 5.0 μm for a 600 volt breakdown voltage ($V_b$).

An etch may be performed at this time to partially or totally remove the dielectric coating 129 (FIG. 7) that covers the tops of the N/P-doped pillars 27. The thickness of the dielectric coating 129 is represented by the letter T which is typically about 0.5-3.0 μm. Depending on the etch process used, and the planarity of the surface, an oxide deposition may be required before the etch step is performed. This oxide layer deposition can be performed by using one of a number of techniques including TEOS oxide deposition. TEOS refers to the chemical tetraethylorthosilicate (TEOS) which is used to deposit the oxide layer (not shown). Alternatively, the oxide layer could be spun-on-glass (SOG), or any other deposited oxide layer.

Figure 8:
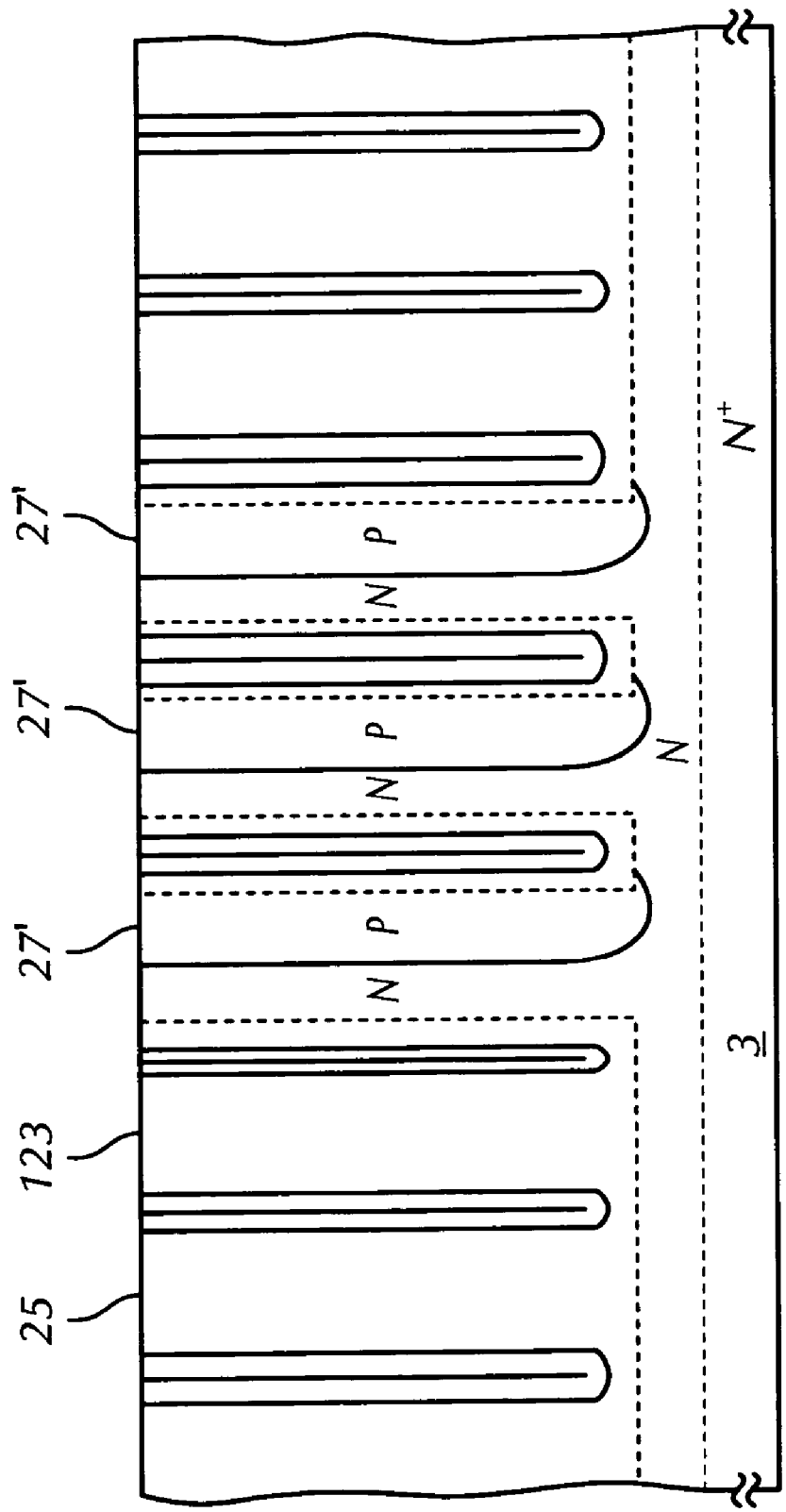
FIG. 8 is a partial sectional view of the semiconductor wafer of FIG. 7 after a planarization step that has removed the oxide from the tops of the pillars of silicon.

Alternately, a planarization step could be performed using chemical mechanical planarization (CMP). FIG. 8 shows the dielectric coating 129 removed from the surface, leaving the tops of the N/P-doped columns 27' exposed in order to create the device features for the transistor. It is also possible to planarize the wafers and to leave a layer of oxide on the tops of the pillars. High-voltage MOS-gated devices may now be manufactured using these substrates, which have regions of thick oxide in the termination region and pillars of silicon containing both n-type and p-type dopant, using well known manufacturing techniques and device geometries.

From the foregoing, it can be seen that the present invention is directed to methods for manufacturing a semiconductor device having an edge termination structure that includes a thick oxide region and a power semiconductor that is MOS-gated. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. A semiconductor device comprising:
   a semiconductor substrate having first and second main surfaces opposite to each other, the semiconductor substrate having a heavily doped region of a first or a second conductivity type proximate the second main surface and a lightly doped region of the first conductivity type proximate the first main surface,
   the first main surface including a plurality of trenches, a plurality of first mesas and a plurality of second mesas, the first mesas having a width substantially less than a width of the second mesas, the trenches being disposed between adjacent mesas, the first mesas being completely formed of silicon dioxide and the second mesas being partially formed of silicon dioxide and partially formed of silicon; and
   a doped oxide layer within at least the plurality of trenches.

2. The semiconductor device of claim 1, wherein a PN junction is located along the depth direction of the plurality of trenches.

3. The semiconductor device of claim 1, wherein the doped oxide contains at least one of boron and phosphorus.

4. The semiconductor device of claim 1, wherein the trenches have a width of between about 0.5 and 5.0 micrometers.

5. The semiconductor device of claim 1, wherein the trenches are generally wider at their tops by about 1%-10% than at their bottoms.

6. The semiconductor device of claim 1, wherein the semiconductor device is used to form one of a high voltage metal oxide semiconductor field effect transistor (MOSFET) and a high voltage insulated gate bipolar transistor (IGBT).

7. The semiconductor device of claim 1, wherein the trenches extend from the first main surface substantially all the way to an interface between the heavily doped region and the lightly doped region.

8. The semiconductor device of claim 1, wherein the trenches extend from the first main surface to a position in the lightly doped region separated from an interface between the heavily doped region and the lightly doped region.

9. A semiconductor device comprising:
a semiconductor substrate having first and second main surfaces opposite to each other, the semiconductor substrate having a first doped region of a first or a second conductivity type proximate the second main surface and a first doped region of the first or second conductivity type proximate the first main surface,
the first main surface including a plurality of trenches, a plurality of first mesas and a plurality of second mesas, the first mesas having a width substantially less than a width of the second mesas, the trenches being disposed between adjacent mesas, the first mesas being completely formed of silicon dioxide and the second mesas being partially formed of silicon dioxide and partially formed of silicon; and
a doped oxide layer within at least the plurality of trenches.

10. The semiconductor device of claim 9, wherein a PN junction is located along the depth direction of the plurality of trenches.

11. The semiconductor device of claim 9, wherein the doped oxide contains at least one of boron and phosphorus.

12. The semiconductor device of claim 9, wherein the trenches have a width of between about 0.5 and 5.0 micrometers.

13. The semiconductor device of claim 9, wherein the trenches are generally wider at their tops by about 1%-10% than at their bottoms.

14. The semiconductor device of claim 9, wherein the semiconductor device is used to form one of a high voltage metal oxide semiconductor field effect transistor (MOSFET) and a high voltage insulated gate bipolar transistor (IGBT).

15. The semiconductor device of claim 9, wherein the trenches extend from the first main surface substantially all the way to an interface between the first doped region and the second doped region.

16. The semiconductor device of claim 9, wherein the trenches extend from the first main surface to a position in the first doped region separated from an interface between the first doped region and the second doped region.

* * * * *